United States Patent [19]
Hinshaw et al.

[11] Patent Number: 6,059,116
[45] Date of Patent: May 9, 2000

[54] HEAT SINK PACKAGING DEVICES

[75] Inventors: Howard G. Hinshaw, Dallas; Matthew C. Smithers, Lewisville, both of Tex.

[73] Assignee: Thermalloy, Inc., Dallas, Tex.

[21] Appl. No.: 08/878,093

[22] Filed: Jun. 18, 1997

Related U.S. Application Data

[63] Continuation-in-part of application No. 08/669,875, Jun. 21, 1996.

[51] Int. Cl.$^7$ .................................................... B65D 85/86
[52] U.S. Cl. .......................... 206/714; 206/725; 206/460
[58] Field of Search .................................... 206/701, 722, 206/724, 725, 460, 813, 713–717

[56] References Cited

U.S. PATENT DOCUMENTS

| | | |
|---|---|---|
| 2,643,964 | 6/1953 | Smith-Johannsen . |
| 2,711,382 | 6/1955 | Smith-Johannsen . |
| 3,301,315 | 1/1967 | Webb . |
| 3,509,429 | 4/1970 | Craig et al. . |
| 3,972,821 | 8/1976 | Weidenbenner et al. . |
| 4,505,770 | 3/1985 | Larimore . |
| 4,602,678 | 7/1986 | Fick . |
| 4,966,281 | 10/1990 | Kawanishi et al. ...................... 206/714 |
| 4,966,282 | 10/1990 | Kawanishi et al. ...................... 206/714 |
| 5,033,615 | 7/1991 | Shima et al. ............................. 206/714 |
| 5,064,063 | 11/1991 | Manca et al. ............................ 206/722 |
| 5,168,926 | 12/1992 | Watson et al. . |
| 5,571,594 | 11/1996 | Minowa et al. ......................... 206/713 |
| 5,667,073 | 9/1997 | Okui ........................................ 206/713 |
| 5,747,139 | 5/1998 | Schenz ..................................... 206/710 |
| 5,765,692 | 6/1998 | Schenz ..................................... 206/722 |

FOREIGN PATENT DOCUMENTS

WO 95/02505   1/1995   WIPO .

OTHER PUBLICATIONS

Thermalloy, Inc. catalog, "The Best Thermal Management Solutions from Around the World", Nov., 1996, pp. A2–A7 and D9–D11.

LCC/Disensit®, Dispensit Model 1052, Rod Positive Displacement Dispense Valve, 3 pages.

*Primary Examiner*—Paul T. Sewell
*Assistant Examiner*—Luan K. Bui
*Attorney, Agent, or Firm*—Woodcock Washburn Kurtz Mackiewicz & Norris LLP

[57] ABSTRACT

Heat sinks and electrical components pre-coated with a layer of a material such as thermal grease are disclosed. Contamination and migration of the thermal grease is substantially reduced by covering the coated areas with a release liner that is removed prior to the assembly of the heat sink into a circuit board or other assembly. By providing a pre-coated heat sink, productivity can be enhanced, by increasing accuracy with which the thermal grease is applied, thus eliminating waste and clean up. Methods for pre-coating either a heat sink or the release liner with thermal grease are also disclosed. In preferred embodiments areas of the heat sink can be either fully coated, or portions electively coated, and the coating may be accomplished by a silk screening or pad printing process, which includes using an applicator head. The release liner is preferably provided with a pull-off tab to facilitate the removal of the release liner. The present invention also discloses methods and devices for packaging a heat sink and an electrical component capable of mounting to the heat sink that has a layer of thermal grease disposed on its surface. The present invention also discloses improved methods of installing a heat sink using heat sinks that are pre-coated with thermal grease.

16 Claims, 7 Drawing Sheets

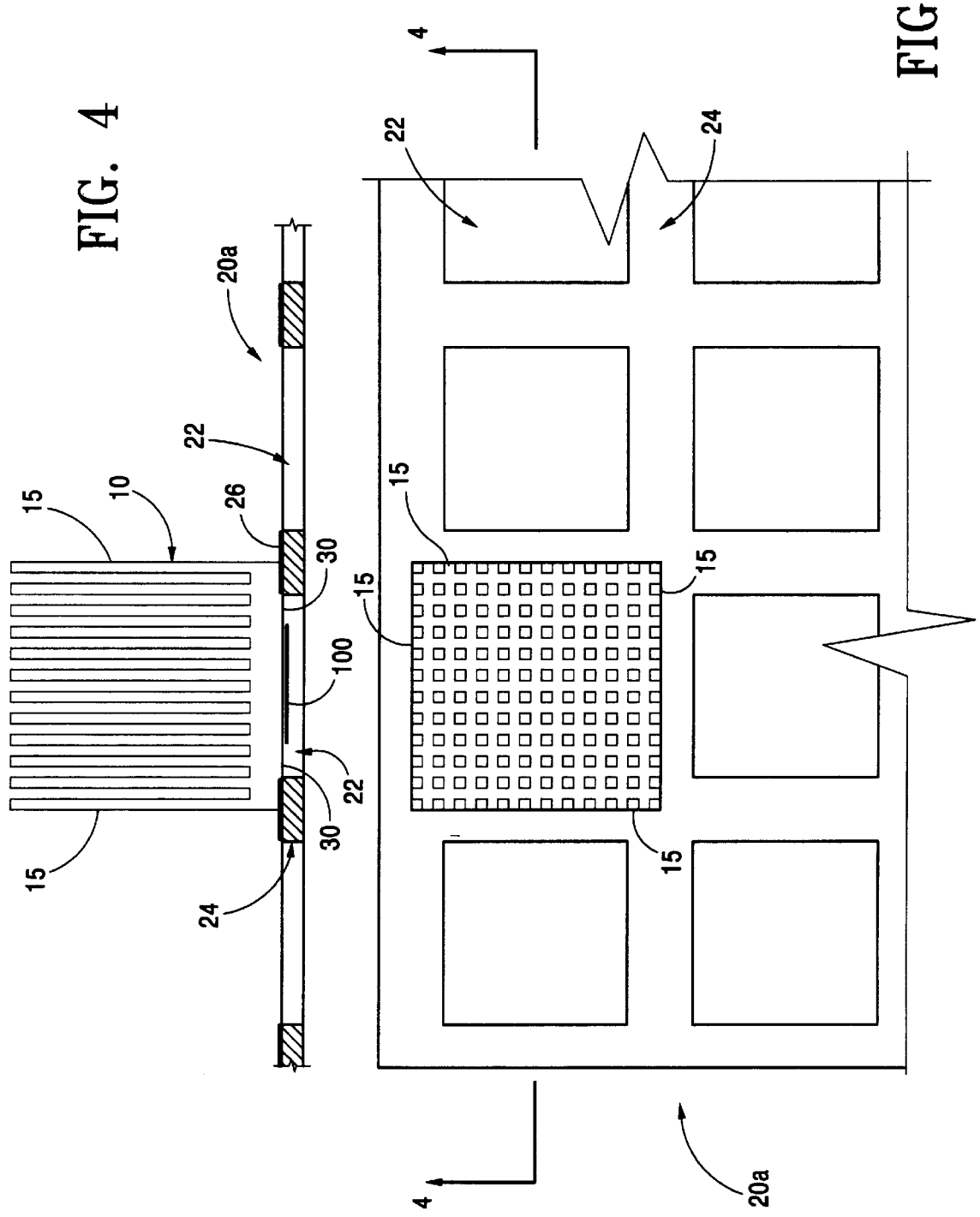

HEAT SINK PACKAGING DEVICES

This application is a continuation-in-part of application Ser. No. 08/669,875, filed Jun. 21, 1996, which is incorporated herein by reference in its entirety.

The present invention relates to electronic component assemblies, and more particularly relates to the application of a substance such as thermally conductive grease between two components.

BACKGROUND OF THE INVENTION

The interface between a heat sink and the component to which it is attached includes small voids due to surface irregularities, roughness, and lack of flatness of the two surfaces. These voids reduce the thermal transmissivity to the heat sink, and thus ultimately reduce the ability of the heat sink to dissipate heat generated by the component. In the past, it has been found that applying a film of thermal grease can diminish or substantially eliminate this problem. Thermal grease, which may also be referred to as thermal compound, is well known in the art and can be a composition of silicone and zinc oxide, available from Dow Corning of Midland, Michigan and other sources. Another thermal grease composition, THERMALCOTE™ is available from Thermalloy, Inc. of Dallas, Texas; another a product sold by the same company and known as THERMALCOTE II™ does not contain silicone. The THERMALCOTE products are available in forms that are applied by brush, squeezed out of a tube, applied by a paddle, or other techniques. Unfortunately, the application of thermal grease to individual components in a production environment is laborious and inexact. Nonetheless, despite numerous efforts to create another interface material to replace it, thermal grease remains the most effective product for ensuring good thermal conductivity.

Thermal grease can be applied directly to an insulator strip. The coated strip is supplied in a package that must be peeled away, and the insulator must then be applied to a component. This product is sold under the name INSUL-COTE by Thermalloy, Inc. of Dallas, Texas. Similarly, it is known to apply a thin layer of thermal grease to both sides an aluminum carrier that is 0.1 mm (0.004") thick. The coated carrier is then disposed between a heat sink and a microprocessor. This product is sold under the name CONDUCTA-COTE(™) by Thermalloy, Inc. of Dallas, Texas. However, the use of such coated insulators or aluminum carriers does not eliminate the above-mentioned problems, since handling the grease-coated insulation or carrier is nearly as difficult as applying the grease from a tube or with a brush. The insulators and carriers can be obtained in strip form and applied by a machine, which alleviates some of these problems. However, this adds a production step and the capital cost of the application machine if the supplier of the pre-coated insulators or carriers does not provide one. The advantage of pre-coated insulators or carriers is that they apply a specific amount of grease, and a specific quantity of grease may be purchased by ordering coated insulators or carriers on a one-to-one basis with the heat sinks. However, a disadvantage of the above-described pre-coated insulators and aluminum carriers that are pre-coated with thermal grease is that they are difficult to manufacture.

As mentioned above, others in the art have attempted to create pads of material that serve as a replacement for thermal grease. Some of these products are insulating, while some more recent versions are not. Although such pads reduce the waste and inaccurate application related to the use of a thermal enhancement product, they are often more expensive and do not offer the thermal performance of grease. Therefore, it would be desirable to provide a product in which the thermal properties of grease are advantageously available to create a better thermal connection between a heat sink and a heat-emitting component. Moreover, it would be further desirable to reduce or eliminate waste, spillage and over-application of thermal grease. It is therefore an object of the present invention to provide products and methods in which thermal grease is applied in a precise and controlled manner. It is a further object of the present invention to provide products and methods that readily adapt to production environments and that do not require significant alteration of existing production sequences or changes in production tooling.

It is yet a further object of the present invention to provide products and methods for handling, shipping, and storing of heat sinks having a surface that is pre-coated with thermal grease.

SUMMARY OF THE INVENTION

It has now been found that these and other objects of the present invention are met by pre-applying coatings and substances such as thermal grease to components such as heat sinks. The relevant area is covered with a protective sheet, e.g., a thin film or paper, termed a release liner. The assembler removes the protective sheet, preferably using a pull-off tab provided for that purpose. After the release liner is removed, the heat sink is assembled to a microprocessor or other semiconductor device, or any source of heat. Alternatively, the release liner or paper can be pre-coated and applied to the component.

The present invention therefore discloses either heat sinks, electrical components that are destined to be mounted to the heat sinks, or corresponding release liners that are pre-coated with a layer of a material such as thermal grease that provide several advantages over the prior art. For one, contamination and migration of the thermal grease is substantially reduced by covering the coated areas with a release liner that is removed prior to the assembly of the heat sink into a circuit board or other assembly. By providing a pre-coated heat sink, productivity is enhanced by increasing accuracy with which the thermal grease is applied, thus eliminating waste and clean up. The present invention is thus also directed to improved methods for pre-coating a heat sink with thermal grease in which areas of the heat sink can be either fully coated, or portions electively coated; alternatively, the release liner or the electrical component can be pre-coated. The coating may be accomplished by a silk screening process or a pad printing process, which includes using an applicator head. The release liner is most preferably provided with a pull-off tab to facilitate the removal of the release liner. Finally, the present invention also discloses improved methods of installing a heat sink using heat sinks that have an area where thermal grease is pre-applied and covered by a release liner.

In a related aspect of the present invention, various embodiments of a packaging member are provided. One embodiment of the packaging member is the release liner. Other embodiments of the invention include packaging members that comprise structure that forms a cavity surrounding the heat sink thermal grease. The cavity protects the thermal grease from contact and dust contamination, even without a release liner disposed on the thermal grease. Such cavity may be formed in a flat sheet of cardboard, plastic, or similar material, by positioning the heat sink on a pedestal formed on the flat sheet. Also, the cavity may be formed by placing the heat sink on its side and bracing the grease portion so as to prevent contact thereof. The cavity may also be formed beneath a cap disposed over the grease. The packaging member according to the present invention is preferably employed with additional, conventional packaging structure (such as, for example, an outer cardboard box) to form a complete package for handling, storing, and shipping heat sinks having a coating of thermal grease. The present invention also encompasses methods for protecting the heat sink thermal grease layer from contact. Although the present invention is illustrated with reference to a heat sink, the present invention encompasses packaging members applied to electrical components that are suitable for mounting to the heat sinks described herein.

BRIEF DESCRIPTION OF THE DRAWINGS

FIG. 3 is an embodiment of packaging member according to the present invention, shown coupled with a heat sink;

FIG. 4 is a sectional view of the packaging member of FIG. 3;

DETAILED DESCRIPTION OF THE PREFERRED EMBODIMENTS

Figure 1:
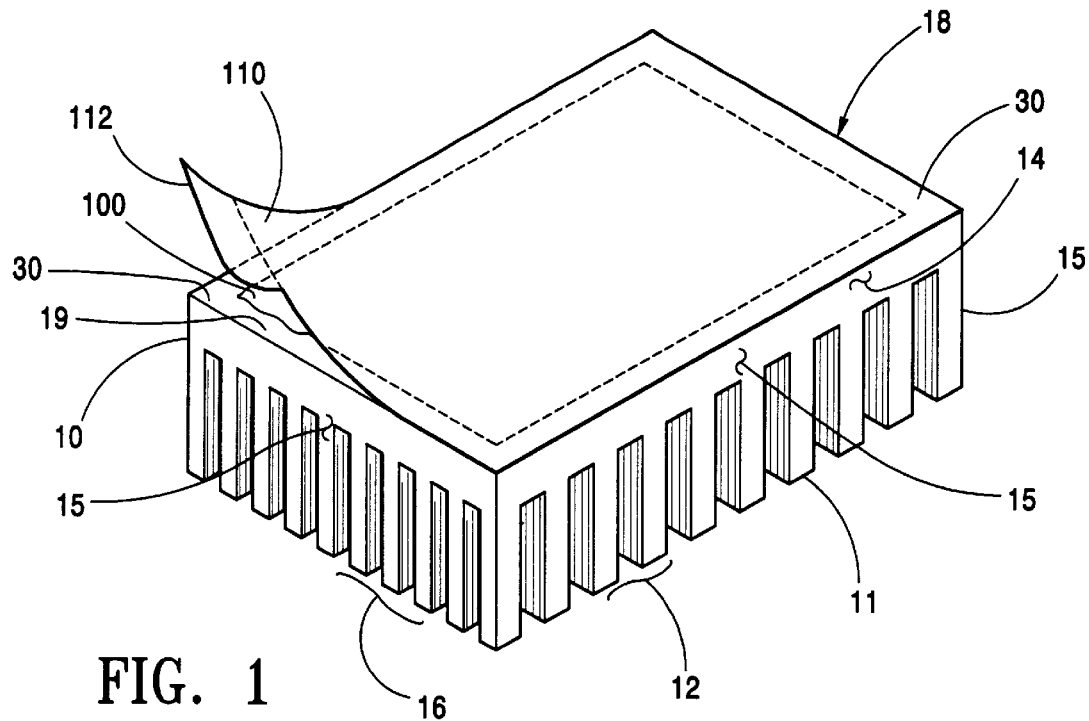
FIG. 1 is a perspective view of an embodiment of the present invention.

Referring now to FIG. 1, a heat sink 10 comprises a body 18 that includes a plurality of fins 11 extending from a heat dissipation side 12 and a component-facing side 14. The component-facing side 14 is covered with a layer of material 100 and, according to a first embodiment of the present invention, a release liner 110 overlies the layer of material 100. For purposes of illustration, FIG. 1 shows one corner of the release liner 110 upturned to expose the layer of material 100. It will be understood, however, that in circumstances in which a release liner 110 is employed, the heat sink 10 is delivered with a sheet of protective material 110 overlying the layer of material 100. Moreover, the present invention is not limited to the geometry of heat sink 10, shown in FIGS. 1 and 2, wherein heat dissipation side 12 and component-facing side 14 are opposed. Specifically, the present invention encompasses heat sinks that have a body 18 of any shape and a component-facing side 14 disposed on the body 18. Although the present invention may be also employed with either a release liner or an electrical component that is suitable for mounting to a heat sink, for clarity the present invention is illustrated with reference to the heat sink type shown in FIG. 1.

The layer of material 100 most preferably comprises a thermal grease or a thermal compound, the use of which is well known in the art as discussed above. It will be realized, however, that thermal grease is not the only type of material that can utilize the concepts disclosed herein. Numerous other property enhancing coatings, such as conductive powders, gels, dispersions, etc. can be used, as well as compliant coatings that absorb shock. In FIG. 1, the layer of material 100 is shown in phantom except where the release liner 110 is again shown as being lifted up for purposes of illustration.

Figure 2:
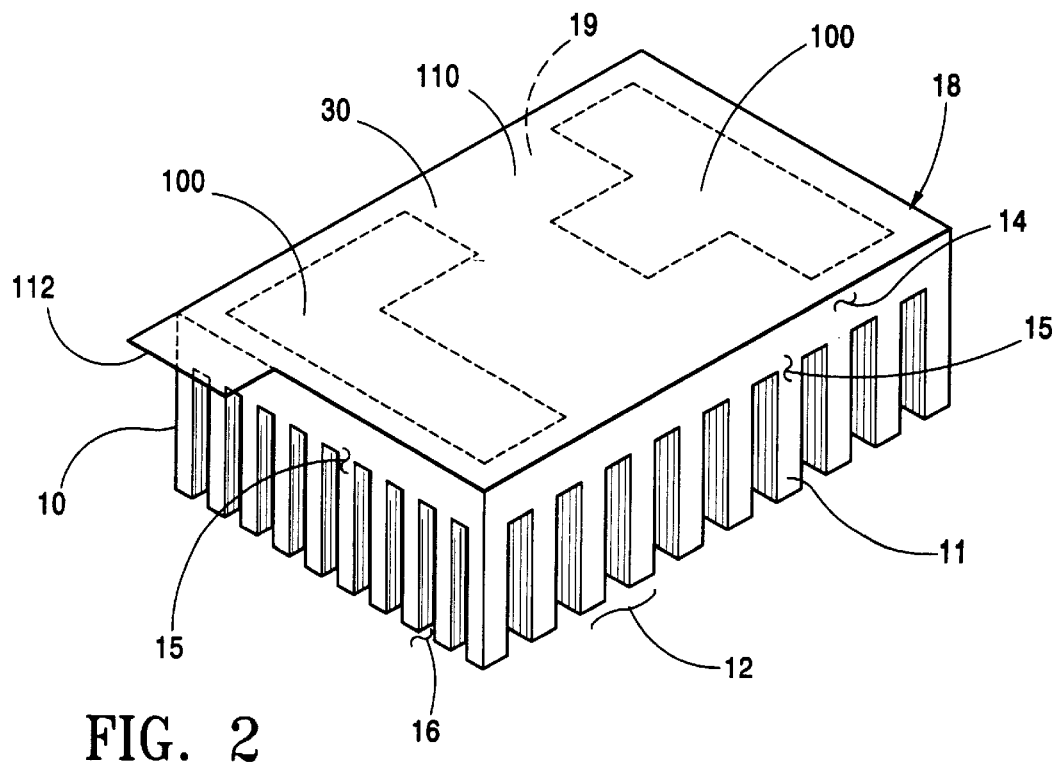
FIG. 2 is a perspective view of an alternate embodiment of the present invention.

In certain embodiments, layer of material 100 is applied over substantially the entire component-facing side 14 as shown in FIG. 1. However, as seen in FIG. 2, the layer of material 100 alternatively can be applied over predetermined portions 102 of the component-facing side 14. In certain embodiments, release liner 110 is adhered to the layer of material at one or more edges of the component-facing side 14. In the embodiment illustrated in FIG. 2 the areas 102 that are coated with the material 100 are shown in phantom. In either the embodiment of FIG. 1 or FIG. 2, it is shown that the release liner 110 overlies the entire component-facing side 14, although it will be understood that the present invention contemplates embodiments in which the release liner 110 is discontinuous, made of several sections, slit, perforated, or otherwise does not cover the entire component-facing side 14. In certain embodiments, at least a portion of the release liner 110 extends beyond an edge of the heat sink 10. A portion of the release liner 110 extends beyond an edge of the heat sink 10 and forms a pull-off removal tab 112. Release liner 110 may also be smaller than the surface 14 of heat sink 10 such that removal tab 112 or a corner of release liner 110 lacks adhesive, thereby enabling grasping of release liner 110.

The present invention contemplates that the release liner 110 can be made from any suitable material. As will be readily appreciated by those of skill in the art, suitable materials include those that are easily released from the component, that resist deterioration due to exposure with the thermal grease, and those that resist absorption of the thermal grease, in order to keep the external packaging free of contamination and to preserve the precise quantity of grease that has been applied. Preferably, the release liner 110 comprises an opaque paper product or film, but may also comprise a transparent material, such as MYLAR.

In another aspect of the present invention, improved methods of applying thermal grease to a heat sink are provided. In a preferred embodiment, the methods of the present invention comprise the steps of identifying an area to receive thermal grease and applying thermal grease to the area. The thermal grease is then covered with a packaging member, which may include a release liner or a pedestal and cavity, as will be described more fully below. An alternative method according to the present invention includes applying thermal grease to pre-selected areas of the release liner, and then applying the coated liner to the heat sink or other component such that the grease coated side of the liner comes into contact with the component. The method according to the present invention encompasses coating a surface of an electrical component (not shown) prior to mounting the electrical component and the packaging member together. The method may be employed with any electrical component that is suitable for combining with a heat sink 10, including for example microprocessors, rectifiers, converters, power supplies, and the like.

As will be realized by those of skill in the art, there are a number of techniques for applying thermal grease to the surface of a heat sink in accordance with the present invention. One technique is to silk screen the grease on to the surface of the heat sink. In another embodiment, pad printing can also be used in place of silk screening. In this embodiment an appplicator head, a rubber pad, or other suitable carrier is applies grease to either the component or the release liner. When the pad is removed, a "printed" area of thermal grease will be deposited in the appropriate area. The determination of the thickness of the coating can be easily determined by trial and error, and will not require undue amounts of experimentation. Co-pending U.S. patent application Ser. No. 08/877,944, filed Jun. 17, 1997, entitled "Applicator Head and Method for Using Same," which is assigned to the assignee of the present invention and which is incorporated herein by reference in its entirely, teaches a preferred embodiment of coating devices and methods.

Regardless of the apparatus used to apply thermal grease 100, the present invention contemplates methods wherein discrete areas are selectively coated, as well as methods in which an entire surface of a component is coated. After the grease has been applied, the step of protecting the thermal grease with a protective packaging member is undertaken, and this preferably comprises either applying a release liner 110 or applying a packaging member having a pedestal and cavity over the thermal grease. As described above, the release liner 110 preferably is formed of an opaque paper product or film, but may also be formed of a transparent material, such as MYLAR.

According to another aspect of the present invention, release liner 110 or surface 14 may be coated with an adhesive 19, as shown in FIGS. 1 and 2. On areas of contact between the release liner 110 and surface 14 that lacks grease 100, the adhesive will hold release liner 110 and heat sink 10 (or electrical device) together. Adhesive 19 may be formed of any suitable material, and may be applied in any manner, that enables release liner 110 to be removed from heat sink 10 when heat sink 10 is ready for installation.

Additionally, as explained above, although it is preferred that the component be coated with thermal grease, application are envisioned wherein the release liner will be coated first, and then the coated liner applied to the component. Similarly, the present invention encompasses coating of an electrical component, as will be explained more fully below.

Another aspect of the present invention is the disclosure of improved methods for installing a heat sink. In accordance with this aspect of the present invention, a protective backing is removed from the heat sink, and the heat sink is installed. Preferably, the step of removing a protective backing comprises the step of grasping a pull-off tab, which, as discussed above, is supplied according to another aspect of the present invention.

It will be understood that although the description herein of the embodiments of the present invention focused upon the application of a material such as thermal grease to a heat sink, and then applying the heat sink to a packaging member, the present invention encompasses applying a layer of thermal grease to a surface of an electrical component (not shown) prior to mounting the electrical component and heat sink 10 together. The method may be employed with any electrical component that is suitable for combining with a heat sink, including for example microprocessors, rectifiers, converters, power supplies, and the like. Similarly, the present invention is equally applicable to and is directed to embodiments wherein the release liner 110 is first coated, continuously or discontinuously, with a coating such as thermal grease, and then the release liner 110 or a portion of it is applied to the back of a component such as a heat sink.

The above description is directed to the embodiment in which the release liner 110 forms a packaging member according to the present invention. According to other embodiments of the present invention, other embodiments of the packaging member are provided. Such packaging members enable handling, shipping, and storing a heat sink that has a layer of thermal grease pre-applied thereon, but that may lack the release liner 110 described above. In this specification and the appended claims, the terms "pre-coated" and "pre-applied" refer to applying a layer of thermal grease at any time before installation of the heat sink. These terms, for example, encompass a coating step that occurs at a heat sink manufacturer, at a distributor or intermediate supplier, or at an assembler (including for example an electronic device manufacturer or assembler, a computer manufacturer or assembler, and similar users of heat sinks) that coats and then stores, handles, or ships the heat sinks. As shown in FIGS. 1 and 2, heat sink 10 preferably has a component-facing side 14, four adjacent side faces 15, and a heat dissipation side 16. A portion of side 14 receives of thermal grease material 100. The portion of side 14 that lacks grease 100 is termed the dry portion 30.

Figure 14:
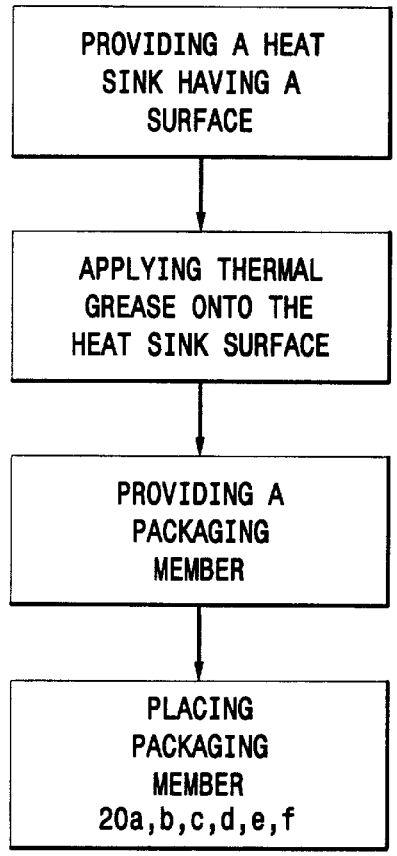
FIG. 14 is a flow chart of the method according to the present invention.

In the following description, the structural description of each particular embodiment is followed by an operational description of the particular embodiment. The operational description is provided in conjunction with a description of the method according to the present invention. As shown in FIG. 14, and as will be described more fully below, packaging members 20a,b,c,d,e,f cooperate with heat sink 10 so as to prevent contact between thermal grease 100 disposed on heat sink 10 and packaging members 20a,b,c,d,e,f. Packaging members 20a,b,c,d,e,f achieve such prevention of contact by forming a cavity that substantially surrounds grease material 100, thereby limiting movement therebetween.

Although the present invention is illustrated, as shown in the Figures, with reference to a heat sink having a component-facing side that is opposite a heat-dissipation side, it will be understood that the present invention is not limited to this narrow type of heat sink. Rather, the present invention may be employed with any and all type of heat sink that may have a portion suitable for coating with a layer of thermal grease, according to the broad inventive concepts of the claims. Application of the present invention to heat sinks of any geometry will be apparent to those familiar with such heat sinks.

Referring now to FIGS. 3 and 4, a preferred embodiment of the packaging member 20a according to present invention is shown. Packaging member 20a preferably comprises a cavity 22, a pedestal 24, and an adhesive coating 26. Preferably, pedestal 24 is formed from a flat sheet of a packaging material. Such packaging material sheet comprises cardboard, although a conventional engineering plastic and the like may be used. Flat sheet packaging member 20a has a cut-out that forms cavity 22 therein. The portion of flat sheet 20a surrounding cavity 22 forms pedestal 24 for receiving a heat sink 10. Packaging member 20a may comprise a single cavity 22, or as shown in FIGS. 3 and 4 a multiplicity of cavities 22 formed in a grid pattern. Adhesive layer 26 is disposed on top of pedestal 24.

In packaging member 20a, dry portion 30 of heat sink 10 contacts pedestals 24, as shown in FIGS. 3 and 4. Adhesive layer 26 bonds dry portion 30 and pedestals 24 together, thereby maintaining the position of material 100 within cavity 22. Heat sink 10 may be removed from packaging member 20a by an assembler when needed.

Figure 6:
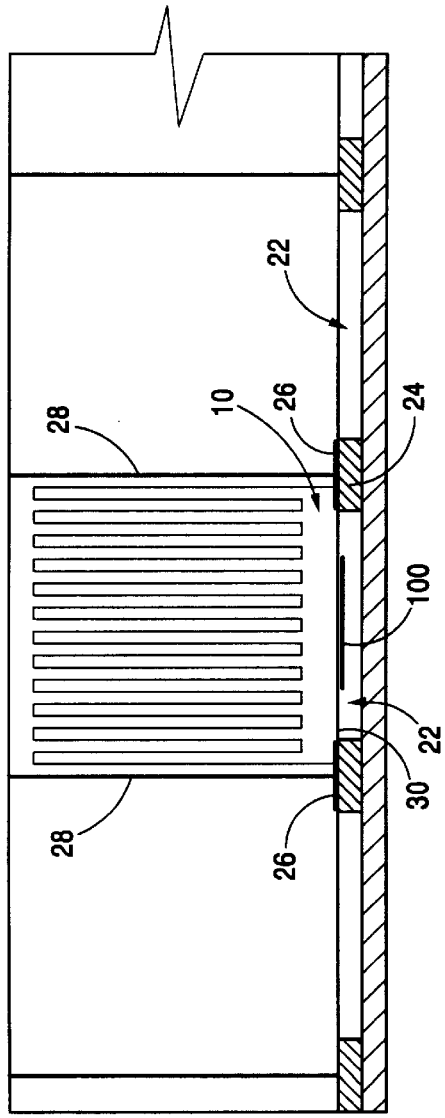
FIG. 6 is a sectional view of the packaging member of FIG. 5.
Figure 5:
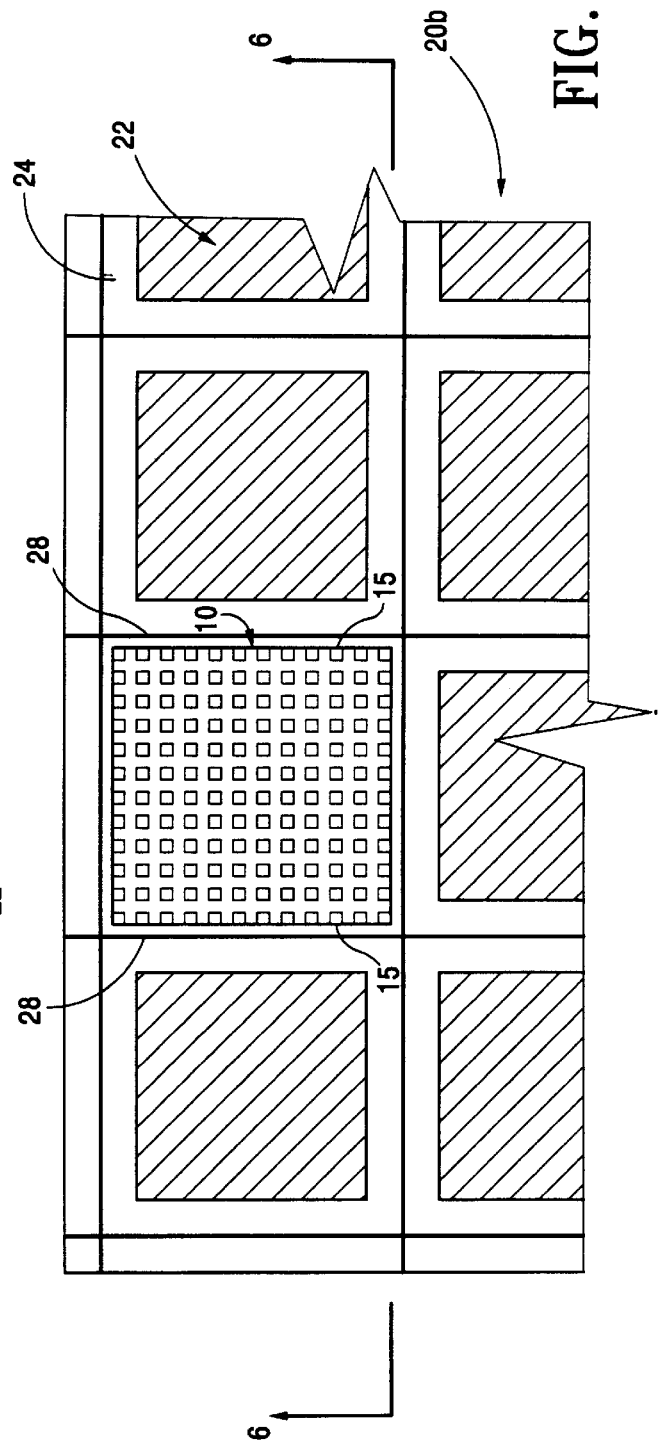
FIG. 5 is an alternative embodiment of the packaging member shown coupled with a heat sink.
Figure 8:
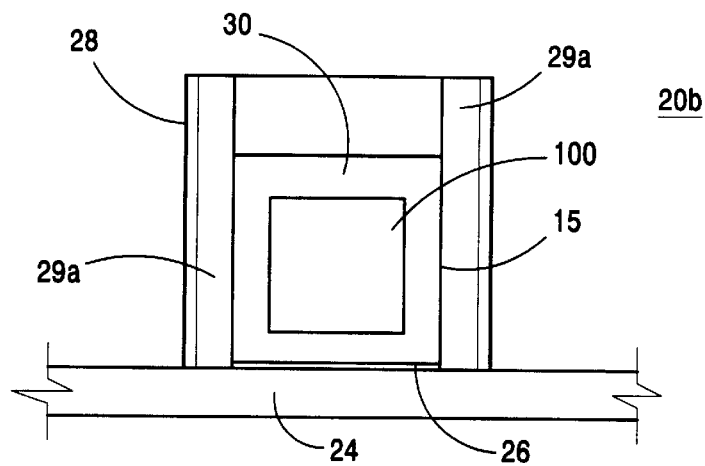
FIG. 8 is a sectional view of the packaging member of FIG. 7.
Figure 7:
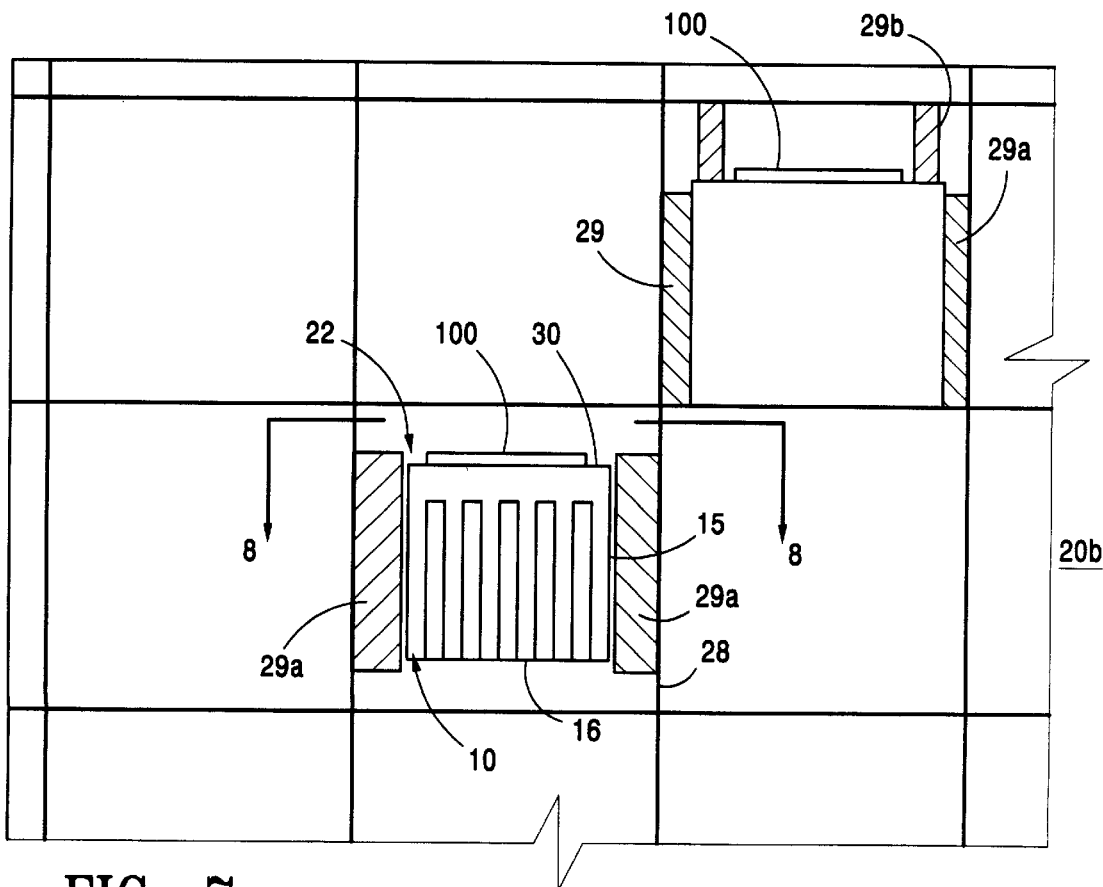
FIG. 7 is another embodiment of the packaging member shown coupled with a heat sink.

Referring to FIGS. 5 and 6, a second embodiment of a packaging member 20b according to the present invention is shown. Packaging member 20b comprises cavities 22 and pedestals 24 that are similar to those described above according to packaging member 20a. Packaging member 20b also includes side members 28, which preferably comprise walls that extend approximately perpendicular from pedestals 24, as shown in FIG. 6. Side member 28 may also comprise beams (shown in FIG. 7), stand-offs, protrusions and the like that are mounted to additional packaging structure or a container (not shown). Such side members 28 prevent contact between material 100 and packaging member 20b. Referring to FIGS. 7 and 8, a packaging member 20b is shown that further includes beams 29a and 29b for holding heat sink 10. Preferably beams 29a contact opposing heat sink side faces 15 and beams 29b contact dry portion 30 of component-facing side 14. Packaging member 20b may also include an adhesive layer 26 disposed between heat sink 10 and sheet 24, as shown in FIG. 6.

Packaging member 20b, as shown in FIGS. 5 through 8, maintains position of material 100 within cavity 22 by using side members 28 and, in some embodiments, beams 29a and 29b. Side members 28b and beams 29a preferably are positioned so that side faces 15 contacts either side members 28 or beams 29a. Alternatively, side members 28 and beams 29a may be positioned to permit some movement of heat sink 10 therein. However, where some travel is permitted, side members 28 and beams 29a limit such travel to prevent contact between the packaging member 20b and grease material 100. Beams 29b are preferably oriented perpendicular to component-facing side 14, thereby limiting travel in the corresponding direction.

Figure 9:
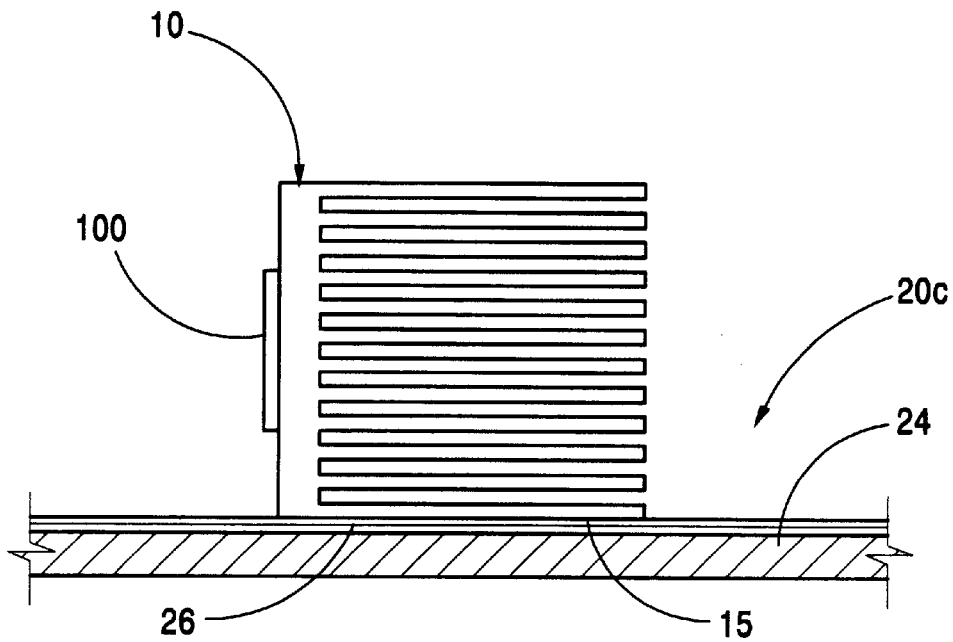
FIGS. 9, 10, and 11 are yet other embodiments of the packaging member shown coupled to a heat sink.

In yet a further embodiment of the present invention, shown in FIG. 9, a packaging member 20c comprises a pedestal 24 that is formed from a flat sheet, and an adhesive layer 26. Preferably, packaging member 20c lacks cavities. Flat sheet pedestal 24 receives any one of the heat sink side faces 15. Adhesive 26 adheres side face 15 of heat sink 15 to pedestal 24, thereby preventing contact between packaging member 20c and grease 100.

Figure 10:
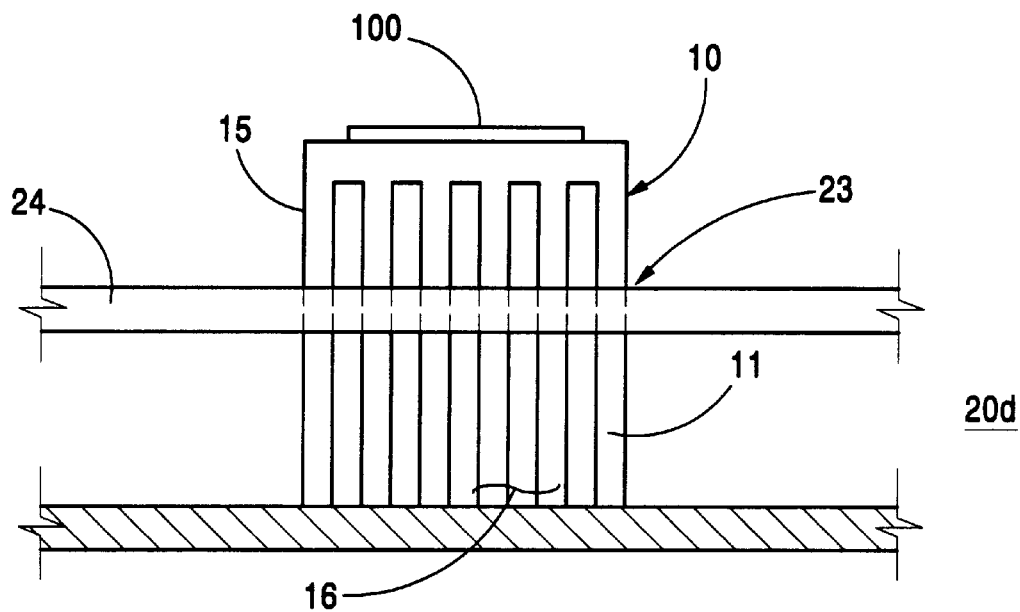

In yet a further embodiment of the present invention, shown in FIG. 10, packaging member 20d comprises a flat sheet pedestal 24 having a plurality of apertures 23 formed therein. The pins 11 or fins (not shown) of heat sink 10 are insertable into apertures 23. Each of the heat sink pins 11 are inserted in a corresponding aperture 23 formed in sheet 24. Preferably, each pin 11 forms a contact fit within each aperture 23, thereby holding heat sink 10.

Figure 11:
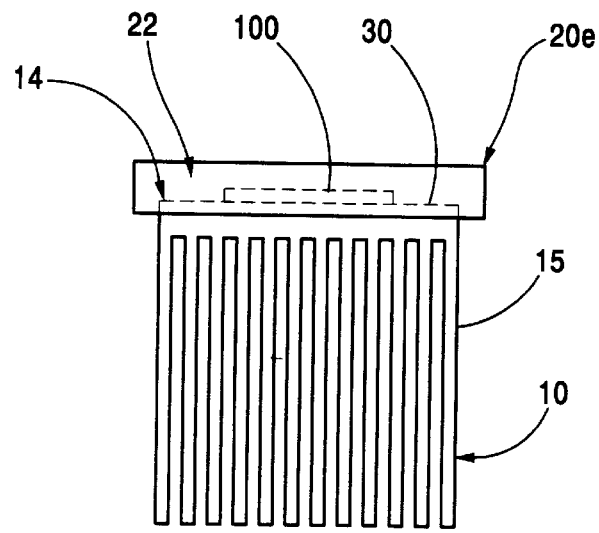
Figure 12:
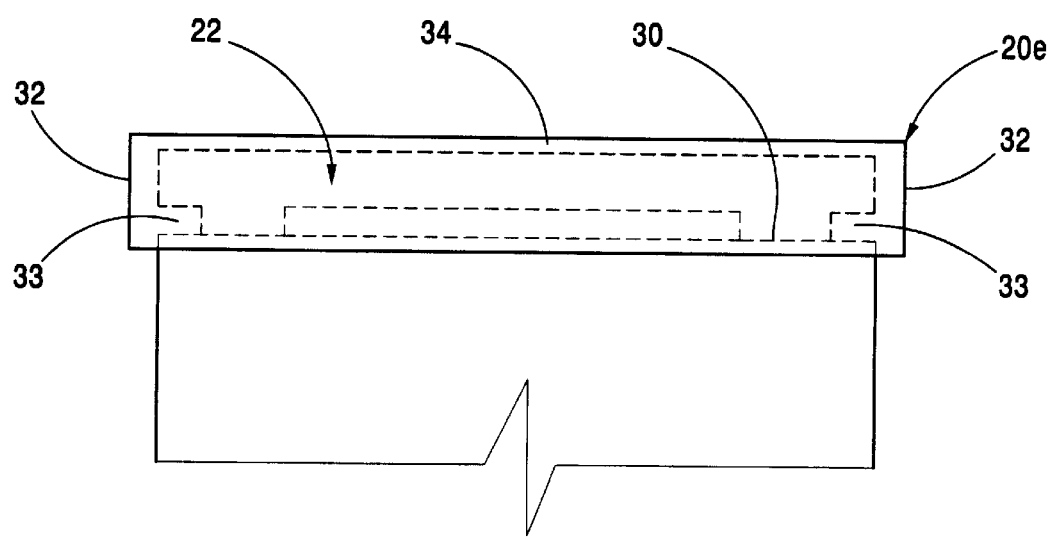
FIG. 12 is a detail view of parts of the packaging member of FIG. 11.

The present invention also encompasses a packaging member in the form of a cap. Referring specifically to FIGS. 11 and 12, a packaging member 20e comprises a cap 20e having sidewalls 32 and a top 34 that is coupled to sidewalls 32. Cap 20e may also include support members 33 that contact dry portion 30 of heat sink component-facing side 14. Cap 20e also may comprise protrusions (not shown) extending from top 34 and contacting the heat sink side face 15.

Referring to FIGS. 11 and 12, a packaging member that comprises a cap 20e substantially encloses grease 100 therewithin. The sidewalls 32 preferably fit tightly around the perimeter of side faces 15 to inhibit movement therebetween. Members 33 prevent top 34 of cap 20e from traveling too far onto heat sink 10, thereby preventing contact between grease 100 and top 34. Alternatively, members 33 may fit into a groove (not shown) disposed in side face 15.

Figure 13:
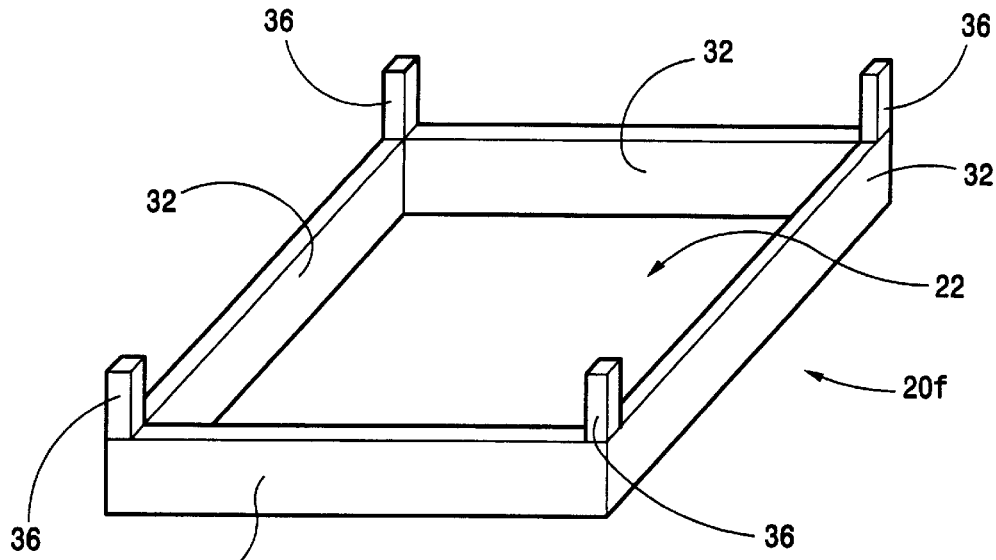
FIG. 13 is yet another embodiment of the packaging member according to the present invention.

Referring specifically to FIG. 13, yet another embodiment of packaging member 20f comprises cap 20f having sidewalls 32 and multiple protrusions 36 extending therefrom. Preferably, each protrusion 36 is coplanar with at least one sidewall 32. Four protrusions 36 are shown in FIG. 13, although the present invention encompasses other quantities of protrusions 36. Protrusions 36 preferably extend above component-facing side 14 is a direction perpendicular thereto.

Referring to FIG. 13, cap 20f includes side walls that contact the heat sink similar to those of cap 20e. Protrusions 36 extend above component-facing side 15 (not shown in FIG. 13) so as to prevent contact with grease 100. Protrusions 36 may be adapted to fit into cavities similar to aperture 23 of packaging member 20d or otherwise adapted to cooperate with other structure. Packaging member cap 20f may be employed in place of beams 29b, which are shown in FIG. 7.

Preferably, pedestal 24 of packaging members 20a,b,c,d are formed from a flat sheet of a packaging material. Such packaging material sheet comprises cardboard, although a conventional engineering plastic and the like may be used. Caps 20e,f are preferably formed from an engineering plastic that has sufficient strength, as will be understood by those familiar with such plastics and their formation into products.

Packaging members 20a,b,c,d,e,f may be employed with additional packaging structure (not shown) that protects and supports packaging members 20a,b,c,d,e,f and augments protection from contact with grease layer 100. Packaging members 20c,d rely more on such additional packaging structure to protect thermal grease 100 than do packaging members 20a,b,e,f, which each alone form a cavity 22 that substantially surrounds grease 10. However, additional packaging structure may be beneficially employed for any of the embodiments. Such additional packaging structure includes, for example, an external box. Grease layer 100 may thereby be substantially protected from contact with packaging members 20a,b,c,d,e,f, and from contact with additional packaging structure (not shown), ambient dust, and personnel. Such additional structure will be apparent to those familiar with the specific heat sink and use of the packaging.

Moreover, the features illustrated in the embodiments described herein may be combined to enhance their protective aspects. For example, adhesive layer 26 may be employed with caps 20e,f to keep caps 20e,f in place; caps 20e,f may be employed with packaging members 20a,b,c,d to augment protection of grease 100; and sidewalls 28 may be employed in other embodiments.

Although certain embodiments of the present invention have been disclosed and described with particularity, these embodiments are provided for the purpose of illustrating the invention and are not meant to be limiting. Upon review of the foregoing specification, those of skill in the art will immediately realize that numerous variations, modifications and adaptations of the invention are possible. Although differing in form and function, such alternate embodiments will employ the spirit of the present invention and are encompassed by the same. Accordingly, reference should be made to the appended claims in order to determine the full scope of the present invention.

What is claimed is:

1. A packaging combination comprising:

a body of one of a heat sink and an electrical component capable of mounting to the heat sink, a pre-applied layer of thermal grease disposed on the body, the body having a component-facing portion that includes a grease coated portion and a dry portion;

a packaging member for protecting the pre-applied layer of thermal grease, comprising:

a pedestal having at least a contact portion contacting at least a portion of the dry portion of the component-facing portion of the body, the contact portion spaced apart from the grease coated portion; and a cavity that is at least partially formed by said pedestal and by the component-facing portion of the body, said cavity disposed proximate the grease coated portion of the body to protect against contact of the grease coated portion.

2. The packaging combination of claim 1 wherein the packaging member includes an adhesive disposed on said pedestal, said adhesive adapted to be placed between said pedestal and the body, whereby the adhesive adheres the body to the pedestal.

3. The packaging combination of claim 1 wherein the packaging member includes at least one side member that is adapted to be placed proximate the body for limiting movement of the body relative to said pedestal.

4. The packaging combination of claim 1 wherein the component facing portion consists of one side of the body.

5. The packaging combination of claim 1 wherein the body of one of a heat sink and an electrical component capable of mounting to the heat sink consists of the body of a heat sink.

6. The packaging combination of claim 1 wherein the body of one of a heat sink and an electrical component capable of mounting to the heat sink consists of the body an electrical component.

7. A packaging combination comprising:

a body of one of a heat sink and an electrical component capable of mounting to the heat sink, said body having multiple uncoated portions and one component-facing portion that includes a pre-applied thermal grease coating;

a packaging member for protecting the pre-applied thermal grease coating, comprising:

a pedestal having a first side member having a surface coupled to at least a first one of the multiple uncoated portions of the body;

a second side member and an opposing third side member coupled to opposing multiple uncoated portions for limiting movement of the body relative to said pedestal; and a fourth side member disposed between the second and third side members, the fourth side member facing the component-facing portion and spaced apart therefrom to form a cavity around the grease coating; whereby the cavity substantially prevents contact between the grease coating and the packaging member.

8. The packaging member of claim 7 further comprising an adhesive disposed on the pedestal surface between said pedestal surface and the first one of the multiple uncoated portions of the body.

9. The packaging member of claim 7 wherein at least one side member is disposed proximate the body for limiting movement of the body relative to the pedestal.

10. The packaging combination of claim 7 wherein each one of the multiple uncoated portions comprise a unique side of the body.

11. The packaging combination of claim 7 wherein the first one of the multiple uncoated portions is a bottom side of the body and the side members contact lateral sides that are adjacent to the bottom side.

12. The packaging combination of claim 7 further comprising beams disposed between the side members and the body.

13. The packaging member of claim 7 wherein the component-facing portion comprises a component-facing side of the body that further includes a dry portion.

14. The packaging member of claim 13 wherein the grease coating has a rectangular pattern and the dry portion is disposed substantially around edges of the grease coating.

15. The packaging member of claim 13 further comprising a beam contacting the dry portion of the component-facing portion of the body to limit movement thereof.

16. The packaging member of claim 14 wherein the beam contacts the fourth side member and extends outward therefrom.

* * * * *